United States Patent [19]

Chan et al.

[11] Patent Number: 5,135,888

[45] Date of Patent: Aug. 4, 1992

[54] FIELD EFFECT DEVICE WITH POLYCRYSTALLINE SILICON CHANNEL

[75] Inventors: Tsiu C. Chan, Carrollton; Yu-Pin Han, Dallas; Elmer H. Guritz, Terrell, all of Tex.

[73] Assignee: SGS-Thomson Microelectronics, Inc., Carrollton, Tex.

[21] Appl. No.: 531,014

[22] Filed: May 31, 1990

Related U.S. Application Data

[63] Continuation-in-part of Ser. No. 298,530, Jan. 18, 1989.

[51] Int. Cl.$^5$ ............................................. H01L 21/44
[52] U.S. Cl. ....................... 437/186; 437/46; 437/48; 437/52; 437/59; 437/60; 437/915
[58] Field of Search .................. 437/46, 48, 50, 186, 437/59, 60, 52, 915

[56] References Cited

U.S. PATENT DOCUMENTS 4,916,665  4/1990  Atruni et al. .................. 365/185
4,918,510  4/1990  Pfiester ........................... 357/42
4,921,813  5/1990  Madan ............................ 437/46

FOREIGN PATENT DOCUMENTS 0026467  3/1981  Japan ............................. 437/46

Primary Examiner—Brian E. Hearn
Assistant Examiner—Tuan Nguyen
Attorney, Agent, or Firm—Kenneth C. Hill; Lisa K. Jorgenson; Richard K. Robinson

[57] ABSTRACT

A CMOS SRAM cell has a polycrystalline silicon signal line between a common node, which is the data storage node, and the power supply. A field effect device is fabricated within this polycrystalline silicon signal line. The channel of the field effect device is separated from an active area in the substrate by a thin gate dielectric, and the active region within the substrate functions as the control gate for the field effect device. Such a device can be used to provide polycrystalline silicon P-channel transistors for use in CMOS SPRAM cells.

10 Claims, 3 Drawing Sheets

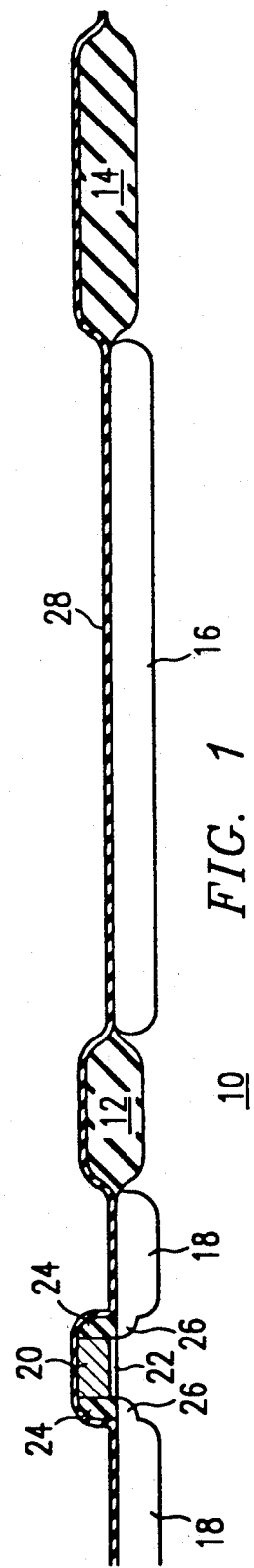
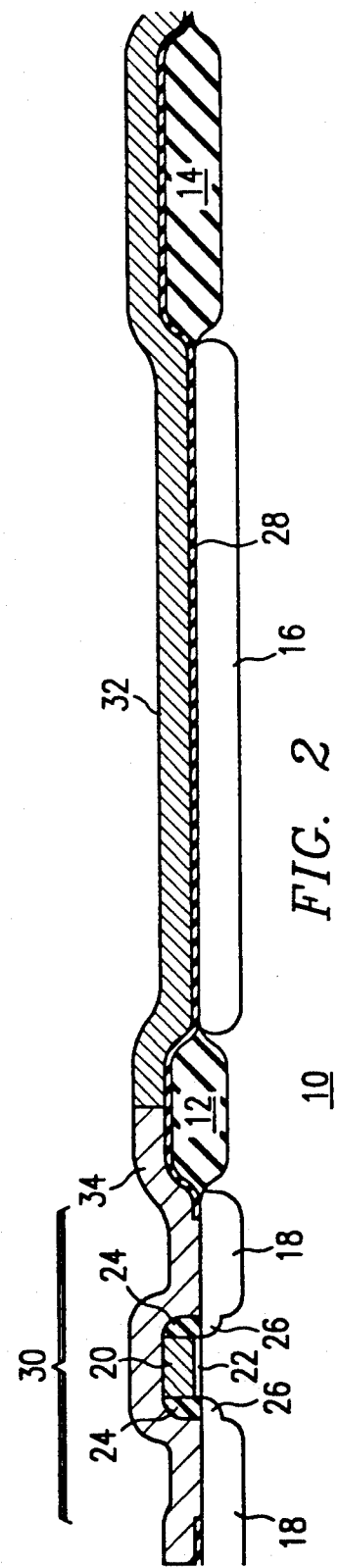
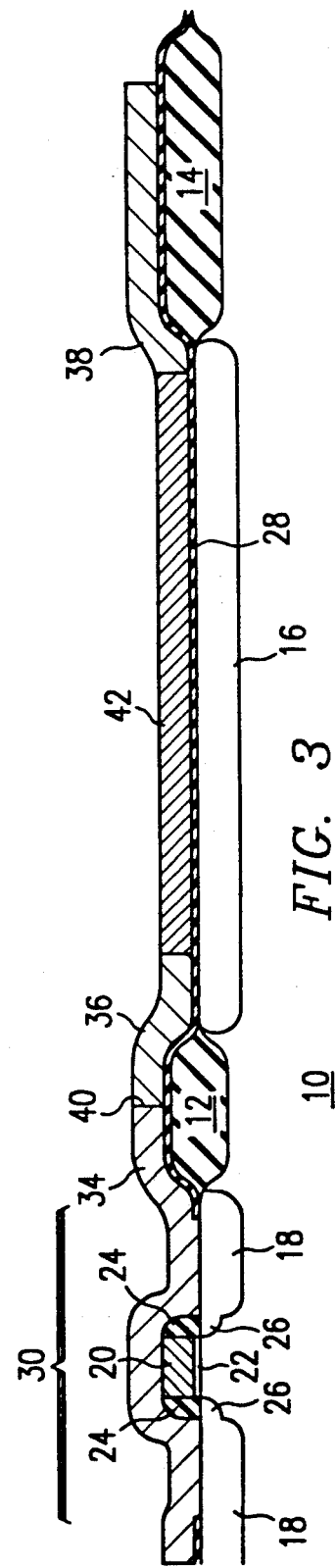

FIELD EFFECT DEVICE WITH POLYCRYSTALLINE SILICON CHANNEL

CROSS-REFERENCE TO RELATED APPLICATIONS

The present application is a continuation-in-part of U.S. patent application Ser. No. 07/298,530, filed Jan. 18, 1989, by T. C. Chan, et al, titled METHOD FOR FABRICATING SEMICONDUCTOR CIRCUITS, and assigned to the assignee of the present application. The entirety of such co-pending application is hereby incorporated by reference hereinto.

BACKGROUND OF THE INVENTION

1. Field of the Invention

The present invention relates generally to integrated circuit devices, and more specifically to a field effect device having a polycrystalline silicon channel.

2. Description of the Prior Art

CMOS static random access memories (SRAM) are increasingly used in the electronics industry due to their combination of speed, low power, and no requirement for refresh. A CMOS SRAM cell is built around a cross-coupled latch and accessed by, typically, 2 control gates for a standard SRAM cell. Four control gates are used to access the cell for 2-port memory devices.

The basic SRAM cell can be formed using cross-coupled CMOS inverters, having 2 each N-channel and P-channel transistors. To conserve physical layout space, the P-channel transistors are often replaced with resistive loads. Typical loads include a polycrystalline silicon resistor, and 2 back-to-back polycrystalline silicon diodes. An example of the latter is described in co-pending U.S. patent application Ser. No. 298,530, filed Jan. 18, 1989, titled METHOD FOR FABRICATING SEMICONDUCTOR CIRCUITS, which has been incorporated by reference hereinto. Resistive loads of either type are formed to have a very high resistance in order to reduce power consumption by the cell.

Use of a P-channel transistor as the load for the SRAM cell results in a cell having better electrical characteristics. Such cells are faster than those using resistive loads, since the P-channel transistors can provide a higher drive current than high resistance devices. Also, use of P-channel transistors gives higher immunity to soft errors, such as those caused by alpha particle impacts and noise. The primary disadvantage of SRAM cells incorporating P-channel load transistors is that the layout area for each cell is significantly larger than those using resistive loads. This reduces device density and increases chip costs.

It would be desirable to provide an SRAM cell which combined the advantages of P-channel loads with the cell layout area requirements of resistive load cells. It would be further desirable to provide a field effect device load, suitable for use with an SRAM cell, which provides increased current drive over resistive loads, and which provides a high OFF resistance.

SUMMARY OF THE INVENTION

It is therefore an object of the present invention to provide a load for CMOS SRAM cells which utilizes P-channel transistors.

It is a further object to provide such a load device which can be fabricated in the same amount of chip area as resistive load cells.

It is another object of the present invention to provide a field effect device having a conductive channel in a polycrystalline silicon signal line.

It is yet another object of the present invention to provide such a field effect device which is suitable for use as a CMOS SRAM cell load.

Therefore, according to the present invention, a CMOS SRAM cell has a polycrystalline silicon signal line between a common node, which is the data storage node, and the power supply. A field effect device is fabricated within this polycrystalline silicon signal line. The channel of the field effect device is separated from an active area in the substrate by a thin gate dielectric, and the active region within the substrate functions as the control gate for the field effect device. Such a device can be used to provide polycrystalline silicon P-channel transistors for use in CMOS SRAM cells.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1-4 illustrate fabrication of a polycrystalline silicon field effect device according to the present invention;

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 1, a cross-section of a portion of a CMOS SRAM cell is shown as being fabricated in a P-type substrate 10. Field oxide regions 12, 14 separate active regions of the device. Active region 16 is located between field oxide regions 12, 14, and forms a common source/drain region for 2 field effect transistors (not shown).

Figure 5:
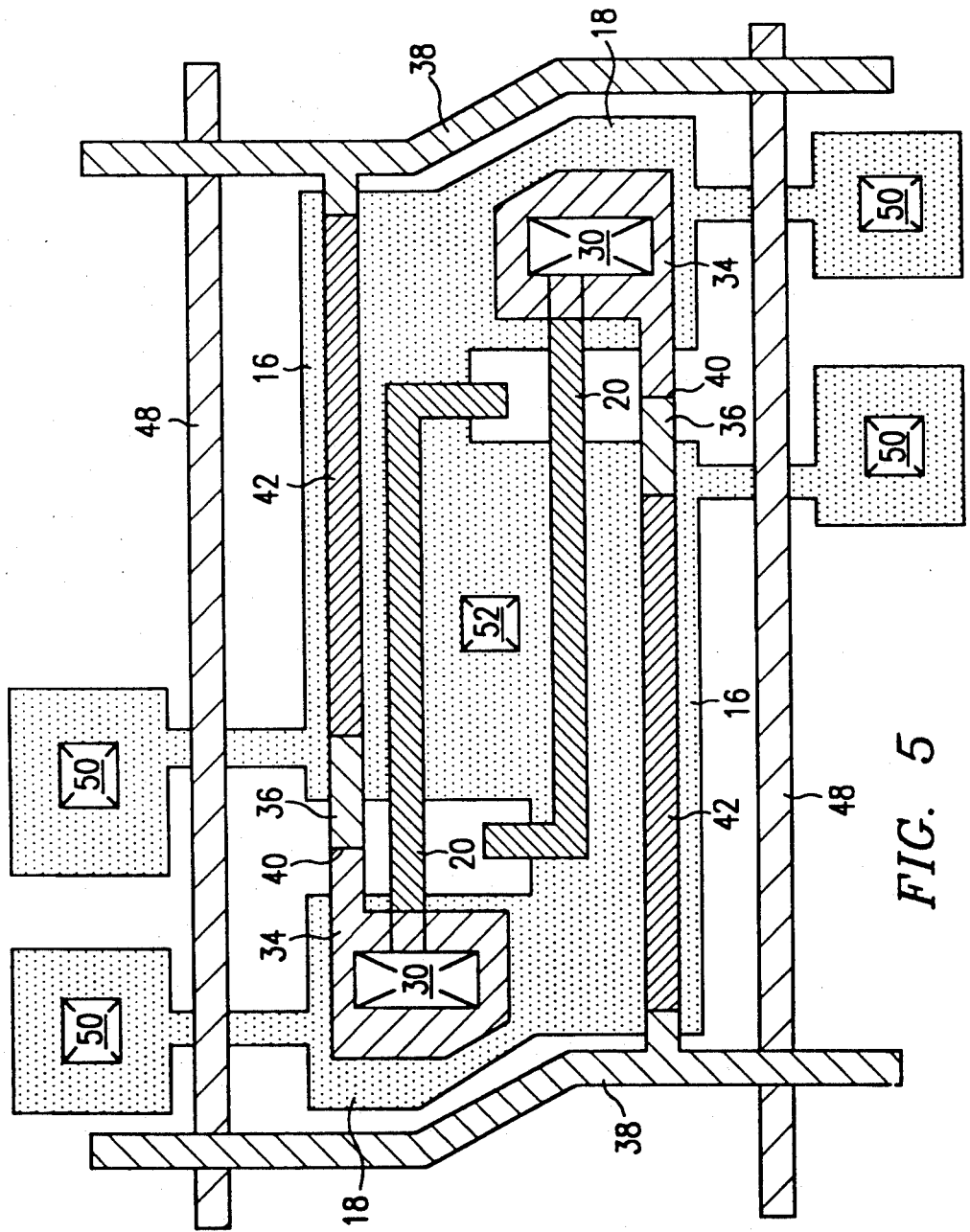
FIG. 5 is a plan view showing the layout of a CMOS SRAM cell utilizing a polycrystalline silicon field effect device according to the present invention.

Active region 18, although shown as separated into 2 parts, is actually a single active region as will be shown in connection with FIG. 5. Polycrystalline silicon gate line 20 is formed over a thin gate oxide layer 22 as known in the art. Sidewall spacers 24 are formed using an anisotropic etch as known in the art, causing the formation of lightly doped drain (LDD) regions 26.

Although polycrystalline silicon line 20 appears to function as the gate of a field effect device in the cross sectional view of FIG. 1, it will actually become the location of a shared contact region to be described below. The impurity doping profiles in the region of the polycrystalline silicon line 20 are the same as those for an actual transistor, but this is merely an artifact of the fabrication process as known in the art. Active regions 18 are connected other than in the plane of the cross section of FIG. 1, and direct electrical contact will be made between the polycrystalline silicon signal line 20 and the underlying active region 18 as will be further described below.

To this point, standard fabrication techniques for a CMOS SRAM are used. Variations from the standard process flows will now be performed in order to fabricate a polycrystalline silicon field effect device according to the present invention.

A thin oxide layer 28 is deposited over the surface of the device, preferably using Plasma Enhanced Chemical Vapor Deposition (PECVD). This allows formation of a good quality oxide layer at relatively low temperatures, between 400° C. and 700° C. Layer 28 is preferably deposited to a thickness of approximately 500 angstroms, followed by a densification step performed by heating the device to a temperature of preferably above 850° C. This densification step, in addition to improving the quality of the oxide layer 28, is also preferably used to anneal and activate the N+ and P+ implants in the active areas of the device. The oxide layer 28 will be used as a dielectric for a field effect device, so the quality of oxide layer 28 is important.

Referring to FIG. 2, a shared contact region 30 is formed in the oxide layer 28 with a mask and etch step, followed by the deposition of an undoped polycrystalline silicon layer 32 to a depth of approximately 2000 angstroms. A mask is then used to define the shared contact region, and an N+ implant is made to form region 34. This N+ region within the polycrystalline silicon layer 32 makes good electrical contact with both the active region 18 and the polycrystalline silicon signal line 20. The N+ implant area is larger than the actual shared contact region 30 and preferably extends part way onto the field oxide region 12.

Referring to FIG. 3, a P+ implant mask is then made, followed by a P+ implant step to form regions 36 and 38. Region 38 forms one source/drain region of the polycrystalline silicon transistor, and the $V_{cc}$ interconnect lines.

P+ region 36 forms the other source/drain region of the polycrystalline silicon transistor, and also forms a diode at its interface 40 with N+ region 34. Preferably, the layout of the photomasks causes the implanted N+ and P+ regions 34, 36 to overlap slightly, to insure diode formation at the resulting interface 40.

N− channel region 42 is then formed by means of a blanket N− implant over the surface of the device. This implant need not be masked, since its doping level is relatively light compared to that of the N+ and P+ regions 34, 38, 40. Region 42 forms the conductive channel of the polycrystalline silicon P-channel transistor for which the P+ regions 36, 38 are the source and drain.

After all implants have been made into the second polycrystalline silicon layer 32, a masking and etch step is performed to define the polycrystalline silicon transistors, the shared contact regions, and the $V_{cc}$ interconnect lines. It is preferable to make all implants into the second layer of polycrystalline silicon before patterning such layer so that the polycrystalline silicon layer can be used to protect underlying areas of the device. The order in which the N+, P+, and N− implants are made is not important. Although these implants have been described above as being performed in the order N+, P+, N−, they could just as easily have been made in the order N−, N+, P+, or any other desired order. As described above, it is not necessary to use a mask for the N− implant.

Figure 4:
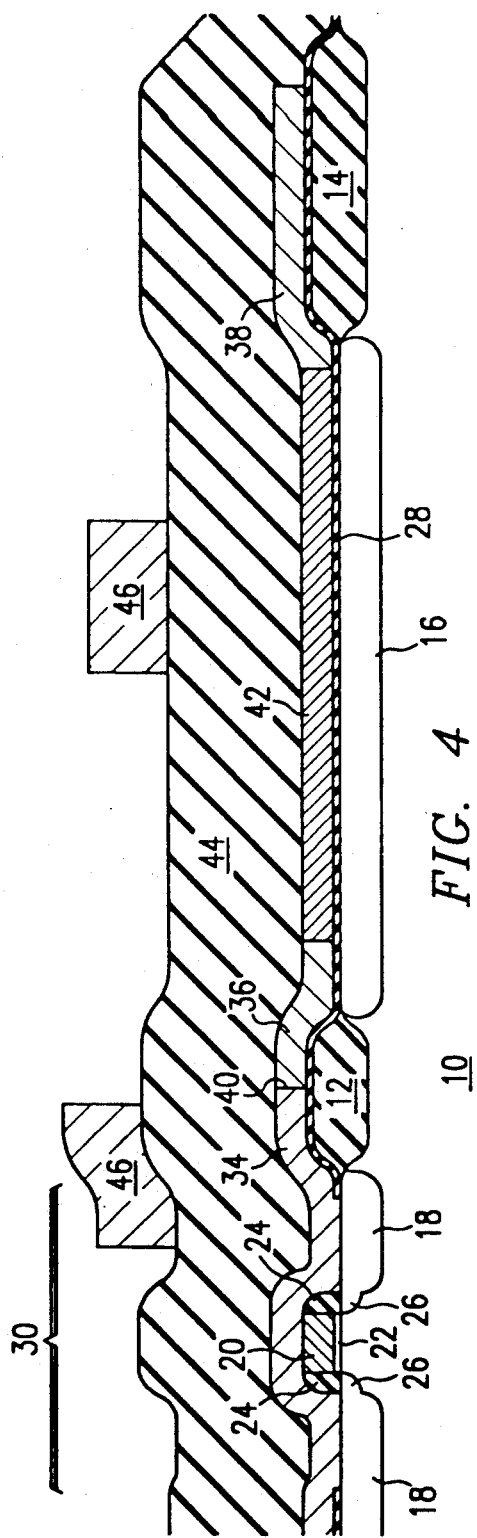

Referring to FIG. 4, once the second layer of polycrystalline silicon has been patterned, a thick oxide layer 44 is then formed over the surface of the chip. Oxide layer 44 is preferably formed from a deposited undoped oxide layer to a thickness of approximately 2000 angstroms, and a PSG or BPSG layer to a thickness of approximately 6000 angstroms. Insulating layer 44 may then be subjected to reflow in order to smooth its contours prior to metal deposition.

After formation of insulating layer 44 is complete, a metal layer is deposited in and patterned to form signal lines 46. The remainder of the processing steps for the device are conventional.

FIG. 5 shows a preferred layout for a CMOS SRAM cell which utilizes the P-channel polycrystalline silicon transistors fabricated as designed above for use as load devices. Further details of such SRAM cell layout are described in the co-pending, related reference which has been incorporated hereinto as described above. In addition to the first level polycrystalline silicon lines 20, word lines 48 are also formed from the first level polycrystalline silicon layer. Contact regions 50 are opened through the overlying insulating layer 44 to make contact with the various metal data signal lines. A metal device ground line makes contact with the SRAM cell through contact region 52.

The cell layout shown in FIG. 5 is an 8-T, dual-port SRAM cell. Each of the polycrystalline silicon lines 48 forms the gate for two N-channel transistors. Each of the signal lines 20 forms the gate for a single N-channel transistor, and the active regions 16 act as gates for the two P-channel polycrystalline silicon devices having channels in regions 42. The P-channel devices are used as load devices between the shared contacts 30 and the $V_{cc}$ signal lines 38.

Figure 6:
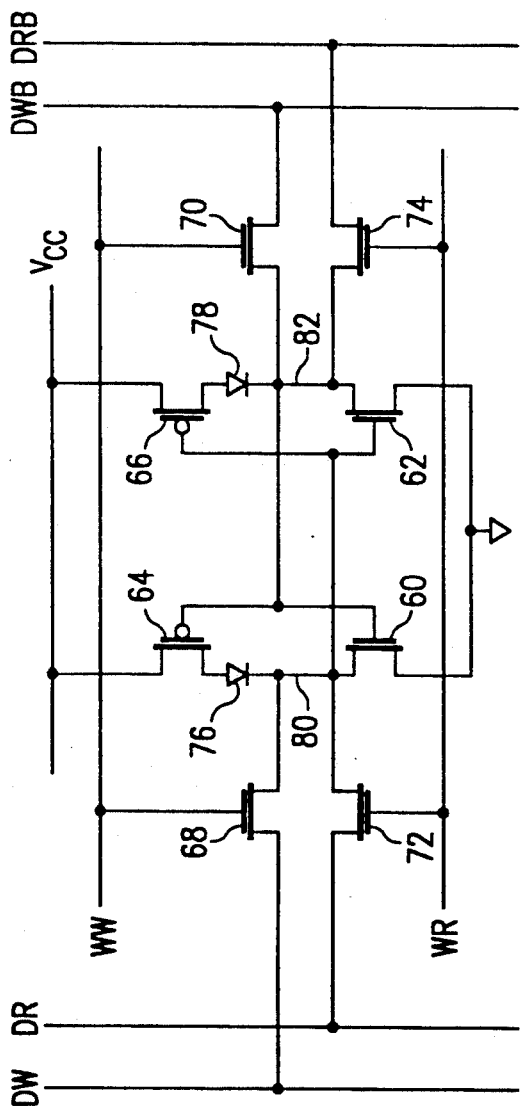
FIG. 6 is a schematic diagram of the SRAM cell of FIG. 5.

A schematic diagram corresponding to the cell layout of FIG. 5 is shown in FIG. 6. N-channel transistors 60, 62 combine with polycrystalline silicon P-channel transistors 64, 66 to form the cross-coupled latch of the cell. N-channel transistors 68 and 70 are connected to the true and complement data write lines (DW) and (DWB) respectively. N-channel transistors 72 and 74 are connected to the true and complement data write signal lines (DR) and (DRB) respectively.

Diodes 76, 78 are those formed by the P-N interfaces 40, and connect to common nodes 80, 82, respectively. The common nodes 80 and 82 correspond to the active region 16 shown in FIGS. 1–4 and act as the gate regions for the P-channel transistors 66, 64.

Transistors 68, 70 are gated by the word write signal line WW, and read transistors 72, 74 are controlled by the word read signal line WR. Lines WW and WR correspond to the polycrystalline word lines 48 shown in FIG. 5. The lines DW, DR, DWB, DRB, and the ground connection are the metal signal lines which make contact to contact regions 50 and 52 of FIG. 5. Operation of the 8-T SRAM cell of FIG. 6 is conventional, and is readily apparent to those skilled in the art.

It will apparent to those skilled in the art that the techniques described above can be used in many different situations. For example, the polycrystalline silicon P-channel loads can be used in single port 6-T cells as well as the dual-port 8-T cells described. Cell layouts other than that shown in FIG. 5 may also be used, and some layouts may make formation of the diodes 76, 78 undesirable or unnecessary.

If desired, the gate oxide layer 28 can be grown instead of deposited, although this relatively high temperature step may not be desirable in some process flows. In addition, circuit designs other than SRAM cells may be able to make use of N-channel polycrystalline silicon transistors, and these can be fabricated using the described techniques simply by forming N+ source/drain regions and a P− channel.

The CMOS SRAM cell described above has several important advantages over prior art cells. The high value polycrystalline silicon resistor and back-to-back diode load devices limited current flow therethrough to approximately a few picoamps, limiting the overall speed of the device. The use of the polycrystalline silicon P-channel devices allows a load of a few hundred nanoamps to drive switching of the SRAM cell. The quality of the polycrystalline silicon transistors is not high compared to those formed in a monocrystalline silicon substrate, but their performance in an SRAM cell is significantly better than that of the previous high resistance load devices.

Since the P-channel devices provide a high resistance when turned off, and a relatively low resistance when turned on, giving a lower impedance path to the power supply, the SRAM cell is more stable to noise and soft errors such as alpha particle impacts. The cell is faster due to the higher switching current, and works well with lower supply voltages.

The particular layout described in connection with FIG. 5 has the advantage that a relatively long, narrow P-channel device is formed. This gives a high OFF resistance desired for the reasons described above, while also providing a significantly lower ON resistance compared to resistive load devices.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a load element for a CMOS SRAM memory cell, comprising the steps of:
    forming an n-channel field effect device in a semiconductor substrate, such field effect device having source/drain regions opposite a gate electrode and a channel under the gate electrode within the substrate;
    forming a gate oxide layer over the substrate;
    forming an opening through the gate oxide layer to expose an underlying conductive region;
    forming a layer of polycrystalline silicon over the gate oxide layer and the exposed underlying conductive region;
    forming p-type source/drain regions in the polycrystalline silicon layer;
    forming a p-channel region in the polycrystalline silicon layer between the p-type source/drain regions; and
    etching portions of the polycrystalline silicon layer to define an elongate p-channel element connecting the p-type source/drain regions, such element having a length substantially longer than a width of the element.

2. The method of claim 1, further comprising the step of:
    forming a second n-channel transistor wherein the exposed underlying conductive region is a source/drain region of the second n-channel transistor.

3. The method of claim 1, further comprising the step of:
    before said etching step, forming an n-type conductive region in the polycrystalline silicon layer adjacent one of the p-type source/drain regions and covering the opening formed in the gate oxide layer, wherein a P-N junction is formed between the n-type conductive region and such p-type source drain region.

4. A method for fabricating a CMOS SRAM cell, comprising the steps of:
    forming two n-channel transistors in a semiconductor substrate, such transistors each having two source/drain regions separated by a channel region and having a gate electrode disposed over the channel region, wherein a first source/drain region of each n-channel transistor is common with the other;
    forming a gate oxide layer over the substrate and the gate electrodes;
    forming openings in the gate oxide layer to expose portions of each gate electrode and a second source/drain region of each n-channel transistor;
    forming a layer of polycrystalline silicon over the gate oxide layer and filling the opening;
    forming alternating p-type and n-type conductive regions within the polycrystalline silicon layer; and
    etching said polycrystalline silicon layer to form two elongate structures, each elongate structure having two ends and a p-channel region between them overlying the second source/drain region of one of the n-channel transistors so that such second source/drain regions function as gate electrodes for the p-channel regions, wherein the elongate structures each connect to power lines at one end and to both a gate of one of the n-channel transistors and the second source/drain region of the other n-channel transistor at the other to form a cross-coupled latch.

5. The method of claim 1, wherein said step of forming alternating p-type and n-type conductive regions comprises the steps of:
    lightly implanting an n-type impurity in a region which will become the p-channel regions;
    heavily implanting a p-type impurity in regions adjacent to the p-channel region to define source/drain regions for the p-channel transistors; and
    heavily implanting an n-type impurity over the openings in the gate oxide layer, wherein P-N junctions are formed between regions containing the heavy p-type implant and regions containing the heavy n-type implant.

6. The method of claim 5, wherein said light implant step is performed after said heavy implant steps.

7. The method of claim 5, wherein said light implant step is performed between said heavy implant steps.

8. The method of claim 5, wherein said heavy n-type implant step is performed before said heavy p-type implant step.

9. The method of claim 5, wherein said gate oxide layer forming step comprises the step of depositing an oxide layer.

10. The method of claim 5, wherein said gate oxide layer forming step comprises the step of growing a thermal oxide layer.

* * * * *